(12) United States Patent
Mao

(10) Patent No.: US 12,264,409 B2
(45) Date of Patent: Apr. 1, 2025

(54) HEATER ASSEMBLY AND SINGLE CRYSTAL PULLER

(71) Applicant: XI'AN ESWIN MATERIAL TECHNOLOGY CO., LTD., Xi'an (CN)

(72) Inventor: Qinhu Mao, Xi'an (CN)

(73) Assignee: XI'AN ESWIN MATERIAL TECHNOLOGY CO., LTD., Xi'an (CN)

( * ) Notice: Subject to any disclaimer, the term of this patent is extended or adjusted under 35 U.S.C. 154(b) by 0 days.

(21) Appl. No.: 18/696,822

(22) PCT Filed: Sep. 30, 2022

(86) PCT No.: PCT/CN2022/122982
§ 371 (c)(1),
(2) Date: Mar. 28, 2024

(87) PCT Pub. No.: WO2023/245909
PCT Pub. Date: Dec. 28, 2023

(65) Prior Publication Data
US 2024/0337043 A1      Oct. 10, 2024

(30) Foreign Application Priority Data
Jun. 21, 2022  (CN) .......................... 202210705520.7

(51) Int. Cl.
*C30B 15/14* (2006.01)
*C30B 15/10* (2006.01)

(52) U.S. Cl.
CPC .............. *C30B 15/14* (2013.01); *C30B 15/10* (2013.01); *Y10T 117/1032* (2015.01)

(58) Field of Classification Search
CPC ......... C30B 15/10; C30B 15/14; C30B 15/30; C30B 29/06
See application file for complete search history.

(56) References Cited

U.S. PATENT DOCUMENTS

| 4,235,848 A | 11/1980 | Sokolov et al. |
| 5,843,228 A | 12/1998 | Saitoh et al. |
| 2017/0022630 A1 | 1/2017 | Lu et al. |

FOREIGN PATENT DOCUMENTS

| CH | 637698 A5 | 8/1983 |
| CN | 108585450 A | 9/2018 |

(Continued)

OTHER PUBLICATIONS

Written Opinion and International Search Report of the International Search Authority corresponding to International Application No. PCT/CN2022/122982, dated Dec. 16, 2022. (9 pages).

(Continued)

*Primary Examiner* — Hua Qi
(74) *Attorney, Agent, or Firm* — Maginot, Moore & Beck LLP

(57) ABSTRACT

A heater assembly is for a single crystal puller. The single crystal puller includes a puller body. A crucible assembly is arranged in the puller body, and a bottom of the crucible assembly is supported by a support structure. The support structure includes a support shaft, and the crucible assembly is driven by the support shaft to rotate. The heater assembly includes a heating part and a conductive part. The heating part covers an outer surface of the crucible assembly, and the heating part is able to rotate synchronously with the crucible assembly. The heating part includes a plurality of connecting electrodes. The conductive part is arranged on the support shaft, and includes a plurality of annular conductive members connected to the plurality of connecting electrodes respectively. External electrodes are connected to the plurality of annular conductive members respectively.

7 Claims, 2 Drawing Sheets

(56) References Cited

FOREIGN PATENT DOCUMENTS

| | | | |
|---|---|---|---|
| CN | 207811928 U | 9/2018 | |
| CN | 108677042 A | 10/2018 | |
| CN | 209397294 U | 9/2019 | |
| CN | 110983430 A | 4/2020 | |
| CN | 111424315 A | 7/2020 | |
| CN | 213146246 U | 5/2021 | |
| CN | 113136618 A | 7/2021 | |
| CN | 114875479 A | 8/2022 | |
| FR | 2433970 A1 | 3/1980 | |
| JP | H02212389 A | 8/1990 | |
| JP | H03199194 A | 8/1991 | |
| JP | 19950761891 A | * | 3/1995 |
| JP | H0761891 A | 3/1995 | |
| JP | H083748 A | 1/1996 | |
| JP | H1081592 A | 3/1998 | |
| JP | H11255591 A | 9/1999 | |
| JP | 2001302391 A | 10/2001 | |
| JP | 2017506206 A | 3/2017 | |
| KR | 100441359 B1 | 9/2004 | |
| WO | 2022065740 A1 | 3/2022 | |

OTHER PUBLICATIONS

English Translation of Written Opinion and International Search Report of the International Search Authority corresponding to International Application No. PCT/CN2022/122982, dated Dec. 16, 2022. (5 pages).
Chinese Office Action corresponding to Chinese Patent Application No. 202210705520.7, dated Apr. 28, 2023. (7 Pages).
English Translation of Chinese Office Action corresponding to Chinese Patent Application No. 202210705520.7, dated Apr. 28, 2023. (8 Pages).
Machine English Translation of CN114875479A. (11 Pages).
Machine English Translation of CN213146246U. (10 Pages).
Machine English Translation of JPH083748A. (6 Pages).
Machine English Translation of JPH0761891A. (5 Pages).
Machine English Translation of WO2022065740A1. (21 Pages).
Machine English Translation of CN209397294U. (8 Pages).
Machine English Translation of FR2433970A1. (9 Pages).
Machine English Translation of JP2001302391A. (10 Pages).
Machine English Translation of JPH1081592A. (14 Pages).
Machine English Translation of JPH03199194A. (6 Pages).
Machine English Translation of CH637698A5. (11 Pages).
Machine English Translation of CN108585450A. (16 Pages).
Machine English Translation of CN108677042A. (10 Pages).
Machine English Translation of CN111424315A. (15 Pages).
Machine English Translation of CN113136618A. (16 Pages).
Machine English Translation of CN207811928U. (13 Pages).
Japanese Office Action corresponding to Japanese Patent Application No. 2024-518923, dated Sep. 19, 2024. (2 Pages).
English Translation of Japanese Office Action corresponding to Japanese Patent Application No. 2024-518923, dated Sep. 19, 2024. (2 Pages).
Korean Office Action corresponding to Korean Patent Application No. 10-2024-7010524, dated Aug. 20, 2024. (7 Pages).
English Translation of Korean Office Action corresponding to Korean Patent Application No. 10-2024-7010524, dated Aug. 20, 2024. (8 Pages).
Machine English Translation of JPH11255591A. (8 Pages).
German Office Action corresponding to German Patent Application No. 11 2022 003 905.1, dated Dec. 5, 2024. (11 Pages).

* cited by examiner

HEATER ASSEMBLY AND SINGLE CRYSTAL PULLER

CROSS-REFERENCE TO RELATED APPLICATION

The present disclosure is the U.S. national phase of PCT Application PCT/CN2022/122982 filed on Sep. 30, 2022, which claims priority to the Chinese patent application No. 202210705520.7 filed in China on Jun. 21, 2022, which are incorporated herein by reference in their entireties.

TECHNICAL FIELD

The present disclosure relates to the technical field of silicon product production, and in particular to a heater assembly and a single crystal puller.

BACKGROUND

The Czochralski method is currently the most important method for producing single crystal silicon in recent years. The hot zone system is one of the most important conditions for the crystallization of silicon materials. The temperature gradient distribution of the thermal field directly affects whether the single crystals can be successfully grew and affects the quality of single crystals. Especially, in the process of growing single crystal silicon materials in the single crystal pullers through the Czochralski method, graphite hot zone are usually used to provide growth temperature, gradient control, etc. In the specific process, polycrystalline materials are melted in a low vacuum environment accompanied inert gas, and single crystal materials are prepared through the contact between a seed and the melt, and the rotation and lifting of the seed. The heat source mainly comes from a graphite heater. In the conventional hot zone structure, the heater is generally a fixed heater located on the periphery of the crucible. The heater generates thermal energy to heat the crucible and silicon material within in the form of radiation. This heating method is indirect heating with low heating efficiency.

SUMMARY

In order to solve the above technical problems, the present disclosure provides a heater assembly and a single crystal puller to solve the problem of low efficiency of indirect heating.

In order to achieve the above purpose, the embodiments of the present disclosure provides: a heater assembly for a single crystal puller, where the single crystal puller includes a puller body, where a crucible assembly is arranged in the puller body, a bottom of the crucible assembly is supported by a support structure, the support structure includes a support shaft, the crucible assembly is driven by the support shaft to rotate, and the heater assembly includes:

a heating part covering an outer surface of the crucible assembly, where the heating part is able to rotate synchronously with the crucible assembly, the heating part includes a plurality of connecting electrodes;

a conductive part arranged on the support shaft, where the conductive part includes a plurality of annular conductive members connected to the plurality of connecting electrodes respectively, and external electrodes connected to the plurality of annular conductive members respectively, the connecting electrodes are able to rotate along the annular conductive members, and the external electrodes are connected to an external power source.

Optionally, the conductive part includes a cylindrical housing sleeved on the support shaft, and a plurality of annular protrusions are arranged on an inner wall of the cylindrical housing at intervals along a circumferential direction of the cylindrical housing to serve as the annular conductive members, and the external electrodes are arranged on an outer wall of the cylindrical housing and connected to the annular protrusions respectively.

Optionally, the cylindrical housing is made of an insulating material.

Optionally, the support structure includes a support tray supporting the bottom of the crucible assembly, the support shaft is arranged at a side of the support tray away from the crucible assembly, the connecting electrodes include a first sub-electrode and a second sub-electrode, the first sub-electrode is connected to the heating part, one end of the second sub-electrode is connected to the first sub-electrode, and other end of the second sub-electrode is connected to the conductive part through a conductor which passes through the support tray and is fixed on the support shaft.

Optionally, a connecting protrusion cooperating with the annular protrusion is at an end of the conductor away from the crucible assembly, and the connecting protrusion is able to move along the annular protrusion.

Optionally, the heating part includes a stripe-like heating element arranged in an S-shape on an outside of the crucible assembly, at least two ends of the stripe-like heating element extend to the bottom of the crucible assembly and connected to the first sub-electrode correspondingly.

Optionally, an insulating thermally conductive layer is arranged between the heating part and the crucible assembly.

Optionally, a heat-insulating protective cover covers on a side of the heating part away from the crucible assembly.

The embodiment of the present disclosure also provides a single crystal puller, including the heater assembly hereinabove.

The beneficial effect of the present disclosure is that the heating part is coated on the outside of the crucible assembly, so that the heat can directly heat the crucible assembly and the silicon material within through thermal conduction, thereby improving the efficiency.

DETAILED DESCRIPTION

Figure 1:
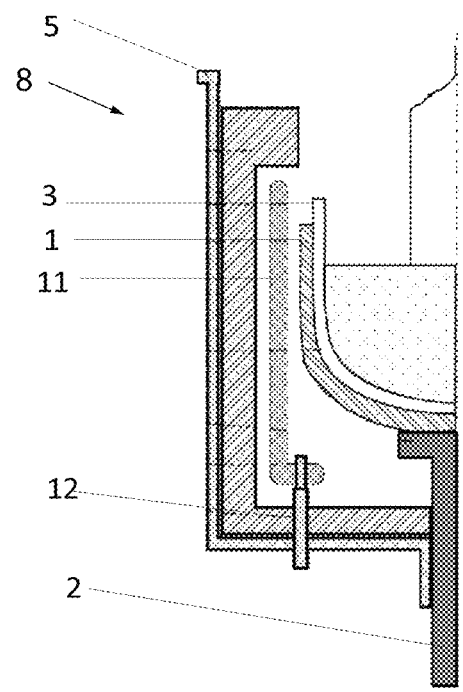
FIG. 1 is a schematic view of a heater assembly in the related art.
Figure 2:
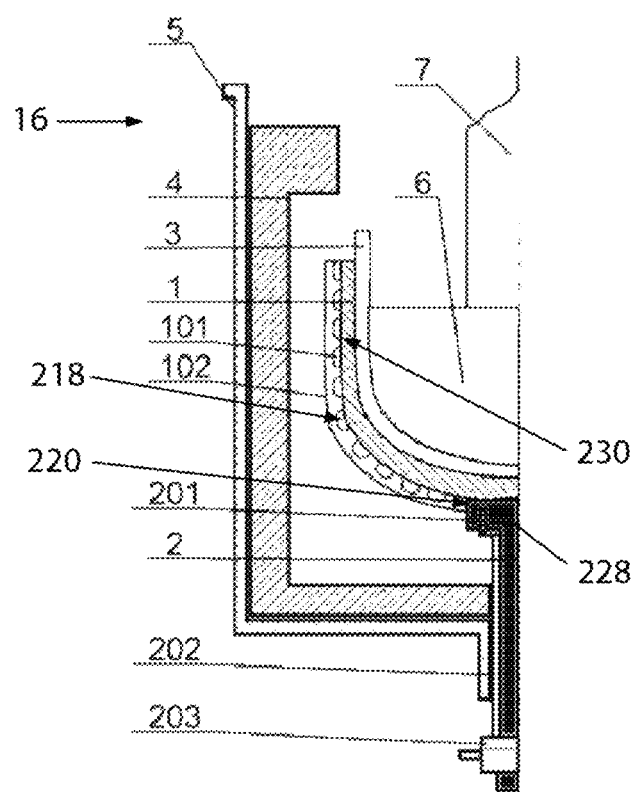
FIG. 2 is a schematic view of a heater assembly in an embodiment of the present disclosure.

In order to make the purpose, technical solutions and advantages of the embodiments of the present disclosure clearer, the technical solutions of the embodiments of the present disclosure will be clearly and completely described below in conjunction with the drawings of the embodiments of the present disclosure. Obviously, the described embodiments are part of the embodiments of the present disclosure, but not all of the embodiments. Based on the described embodiments of the present disclosure, all other embodiments obtained by those of ordinary skill in the art fall within the scope of protection of the present disclosure.

In the description of the present disclosure, it should be noted that the terms "center", "upper", "lower", "left", "right", "vertical", "horizontal", "inner", "outer", etc. The indicated orientation or positional relationship is based on the orientation or positional relationship shown in the drawings. It is only for the convenience of describing the present disclosure and simplifying the description. It does not indicate or imply that the device or element referred to must have a specific orientation or be formed and operated in a specific orientation, therefore it should not be construed as limitations on the present disclosure. Furthermore, the terms "first", "second" and "third" are used for descriptive purposes only and are not to be construed as indicating or implying relative importance.

Referring to FIG. 1, in the related art, a single crystal puller 8 includes a puller body 5. A crucible assembly is arranged in the puller body 5. The crucible assembly is supported by a support structure 2. A heater 11 is generally fixed around the crucible assembly (the crucible assembly includes a quartz crucible and a graphite crucible sleeved outside the quartz crucible). There is a certain distance between the heater 11 and the crucible assembly. The heater 11 is connected to the external power source 216 (also referred to herein as an external power supply) through the electrode 12 located at the bottom of the puller body. The heater generates thermal energy to heat the crucible assembly and the silicon material within in the form of radiation. This heating method is indirect heating with low heating efficiency. To address this problem, the embodiment provides a heater assembly for the single crystal puller 8. Referring to FIGS. 2 to 5, the single crystal puller 16 includes a puller body 5, and a crucible assembly is arranged in the puller body 5. The bottom of crucible assembly is supported by a support structure 2 which includes a support shaft 21. The crucible assembly is able to be driven by the support shaft 21 to rotate. The heater assembly includes:

a heating part 101 covering an outer surface of the crucible assembly, where the heating part 101 is able to rotate synchronously with the crucible assembly, the heating part 101 includes a plurality of connecting electrodes 218;

a conductive part 203 arranged on the support shaft 21, where the conductive part 203 includes a plurality of annular conductive members 2031 connected to the plurality of connecting electrodes 218 respectively, and external electrodes 2032 connected to the plurality of annular conductive members 2031 respectively, the connecting electrodes 218 are able to rotate along the annular conductive members 2031, and the external electrodes 2032 are connected to an external power source 216.

In this embodiment, the heating part 101 covers the outer surface of the crucible assembly, that is, the heating part 101 is in direct contact with the crucible assembly, so that the thermal energy directly heats the crucible assembly and the silicon material within through the way of thermal conduction, thereby improving heating efficiency. However, in the actual process, the crucible assembly needs to be rotated to ensure the shape of the crystal and the convection control of the melt. Therefore, in order to ensure that the heating part 101 remains energized during the rotation of the crucible assembly, this embodiment provides the conductive part 203 including a plurality of annular conductive members 2031 connected to the plurality of connecting electrodes 218 respectively, and external electrodes 2032 connected to the plurality of annular conductive members 2031 respectively. A plurality of connecting electrodes 218 included in the heating part 101 are able to be rotate along the annular conductive member 2031, that is, during the synchronous rotation of the heating part 101 with the crucible assembly, the connecting electrode 218 rotates along the annular conductive member 2031 correspondingly, and the connecting electrode 218 is always in contact with the annular conductive member 2031 correspondingly, thereby ensuring that the heating part 101 remains connected to the external power source 216 through the external electrode 2032 correspondingly connected to the annular conductive member 2031.

In summary, the heater assembly of this embodiment solves the problem of power supply connection of the heating part 101 during the rotation, and at the same time realizes the transformation of the traditional hot zone heating process from heat radiation to solid-to-solid heat conduction, which greatly improves the heating efficiency of the hot zone and equipment, reduces heat loss. In addition, this composite structural design greatly saves the hot zone space in the puller body 5, which is conducive to reducing the size of the equipment or increasing the feeding amount of equipment (increasing the volume of the crucible assembly).

It should be noted that the crucible assembly includes a graphite crucible 1 and a quartz crucible 3 nested together, and the heating part 101 is covered around the outside of the graphite crucible 1.

Figure 4:
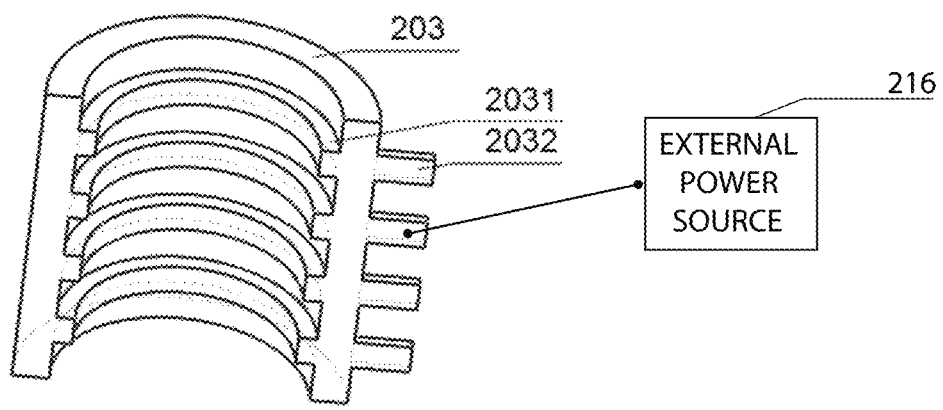
FIG. 4 is a schematic view of a conductive part in an embodiment of the present disclosure.

Referring to FIG. 4, in an exemplary embodiment, the conductive part 203 includes a cylindrical housing 226 sleeved on the support shaft 21, and a plurality of annular protrusions are arranged on an inner wall of the cylindrical housing 226 at intervals along a circumferential direction of the cylindrical housing 226 to serve as the annular conductive members 2031, and the external electrodes 2032 are arranged on an outer wall of the cylindrical housing 226 and connected to the annular protrusions respectively.

For example, the cylindrical housing 226 is made of insulating material to avoid short circuit between adjacent annular conductive members 2031.

In an exemplary embodiment, the cylindrical housing 226 is fixedly connected to the puller body 5.

In an exemplary embodiment, the support structure 2 includes a support tray 228 supporting the bottom of the crucible assembly, the support shaft 21 is arranged at a side of the support tray 228 away from the crucible assembly, the connecting electrode 218 include a first sub-electrode 220 and a second sub-electrode 201, the first sub-electrode 220 is connected to the heating part 101, one end of the second sub-electrode 201 is connected to the first sub-electrode 220, and other end of the second sub-electrode 201 is connected to the conductive part 203 through a conductor 202 which passes through the support tray 228 and is fixed on the support shaft 21.

The connecting electrode 218 is divided into a first sub-electrode 220 and a second sub-electrode 201 that are separately arranged to facilitate the assembly of the crucible assembly, the heating part 101 and the support structure 2.

Illustratively, the second sub-electrode 201 is a bolt electrode, but it is not limited thereto.

Exemplarily, the support tray 228 is provided with a central area and an edge area surrounding the central area. The central area is concave to form a groove, and the bottom of the crucible assembly is a convex part that matches the groove. The second sub-electrode 201 is arranged in the edge area.

The second sub-electrode 201 is a bolt electrode. The edge area is provided with a bolt hole that penetrates the edge area along the axial direction of the support shaft 21. The bolt electrode is spirally installed in the bolt hole. One end of the bolt electrode is connected to the first sub-electrode 220, and other end thereof is connected to the conductive part 203 through the conductor 202.

Figure 3:
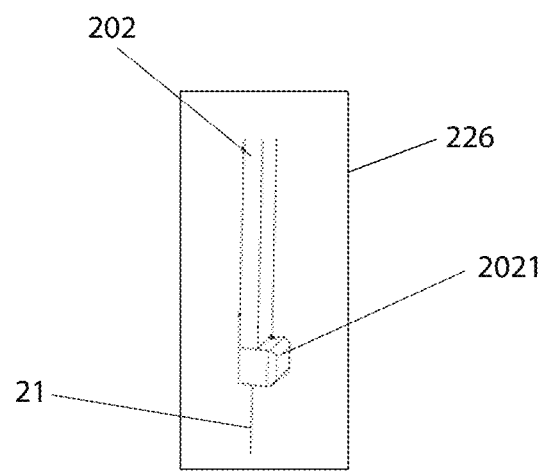
FIG. 3 is a schematic view of a conductor in an embodiment of the present disclosure.

Referring to FIG. 3, in an exemplary embodiment, one end of the conductor 202 away from the crucible assembly has a connecting protrusion 2021 cooperating with the annular protrusion, and the connecting protrusion 2021 is able to move along the annular protrusion.

The conductor 202 is distributed on the outer surface of the support shaft 21 along the axial direction of the support shaft 21. The conductor 202 may be a wire, and the part of the wire exposed from the cylindrical housing 226 is provided with an insulating protective cover.

For example, in the axial direction of the support shaft 21, the height of the connecting protrusion 2021 is less than the distance between two adjacent annular conductive members 2031 to avoid short circuit.

Exemplarily, the conductor 202 is fixed on the support shaft 21 through an adhesive layer. The connecting protrusion 2021 is fixed on the support shaft 21 through an adhesive layer.

Figure 5:
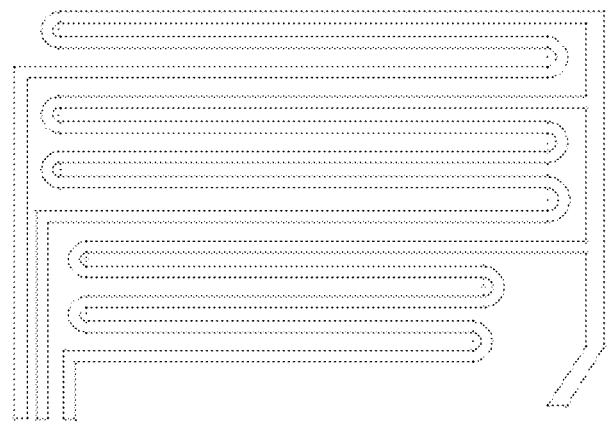
FIG. 5 is a schematic view of a heating part in an embodiment of the present disclosure.

Referring to FIG. 5, in an exemplary embodiment, the heating part 101 includes a stripe-like heating element arranged in an S-shape on an outside of the crucible assembly, at least two ends of the stripe-like heating element extend to the bottom of the crucible assembly and connected to the first sub-electrode 220 correspondingly.

For example, the heating part 101 is a stripe structure and is longitudinally distributed on the outside of the crucible assembly. The longitudinally distributed heating part 101 is able to ensure the heat convection and heat distribution of the melt through the structural distribution and power control of the heating part 101, thereby further optimizing the thermal gradient during the crystal growth process to better control the quality and yield of the grown crystals compared to the related technology.

For example, the thickness of the stripe structure in the radial direction of the crucible assembly is 2-3 cm, but is not limited thereto.

In an exemplary embodiment, an insulating and thermally-conductive layer 230 is arranged between the heating part 101 and the crucible assembly. The insulating thermally conductive layer can be made of materials such as graphite or ceramics.

The crucible assembly is made of graphite material, and the wall thickness of the crucible assembly is 1-2 cm, but is not limited to this.

In an exemplary embodiment, a heat-insulating protective cover 102 is arranged at the side of the heating part 101 away from the crucible assembly. The heat-insulating protective cover 102 can cover the heating part 101 as a whole. On the one hand, it can prevent the deposition of oxides generated during the process on the surface of the heating part 101, affecting the heating effect. On the other hand, it can also prevent the outward thermal radiation of the heating part 101, thereby maintaining heating stability and reducing power consumption.

An embodiment of the present disclosure further provides a single crystal puller 16, including the above-mentioned heater assembly.

The single crystal puller 16 includes a puller body 5, and a crucible assembly (including a graphite crucible 1 and a quartz crucible 3) is arranged in the puller body 5. The silicon melt 6 is contained in the crucible assembly, and the number 7 is a crystal ingot. The heating part 101 is covered on the outside of the crucible assembly, the heat-insulating protective cover 102 is covered on the outside of the heating part 101. The support structure 2 is provided with a second sub-electrode 201 connected to the heating part 101. The second sub-electrode 201 is connected to the conductive part 203 through a conductor 202, the inner part of the puller body 5 is also provided with an insulation layer 4.

It can be understood that the above embodiments are only exemplary embodiments adopted to illustrate the principles of the present disclosure, but the present disclosure is not limited thereto. For those of ordinary skill in the art, various modifications and improvements can be made without departing from the spirit and essence of the present disclosure, and these modifications and improvements are also regarded as the protection scope of the present disclosure.

What is claimed is:

1. A heater assembly for a single crystal puller, wherein the single crystal puller comprises a puller body, wherein a crucible assembly is arranged in the puller body, a bottom of the crucible assembly is supported by a support structure, the support structure comprises a support shaft, the crucible assembly is driven by the support shaft to rotate, and the heater assembly comprises:
   a heating part covering an outer surface of the crucible assembly, wherein the heating part is able to rotate synchronously with the crucible assembly, the heating part comprises a plurality of connecting electrodes;
   a conductive part arranged on the support shaft, wherein the conductive part comprises a plurality of annular conductive members connected to the plurality of connecting electrodes respectively, and external electrodes connected to the plurality of annular conductive members respectively, the connecting electrodes are able to rotate along the annular conductive members, and the external electrodes are connected to an external power source;
   wherein the conductive part comprises a cylindrical housing sleeved on the support shaft, and a plurality of annular protrusions are arranged on an inner wall of the cylindrical housing at intervals along a circumferential direction of the cylindrical housing to serve as the annular conductive members, and the external electrodes are arranged on an outer wall of the cylindrical housing and connected to the annular protrusions respectively; and
   wherein the support structure comprises a support tray supporting the bottom of the crucible assembly, the support shaft is arranged at a side of the support tray away from the crucible assembly, the connecting electrodes comprise a first sub-electrode and a second sub-electrode, the first sub-electrode is connected to the heating part, one end of the second sub-electrode is connected to the first sub-electrode, and the other end of the second sub-electrode is connected to the conductive part through a conductor which passes through the support tray and is fixed on the support shaft.

2. The heater assembly according to claim 1, wherein the cylindrical housing is made of an insulating material.

3. The heater assembly according to claim 1, wherein a connecting protrusion cooperating with the annular protrusion is at an end of the conductor away from the crucible assembly, and the connecting protrusion is able to move along the annular protrusion.

4. The heater assembly according to claim 1, wherein the heating part comprises a stripe-like heating element arranged in an S-shape on an outside of the crucible assembly, at least two ends of the stripe-like heating element extend to the bottom of the crucible assembly and connected to the first sub-electrode correspondingly.

5. The heater assembly according to claim 1, wherein an insulating and thermally-conductive layer is arranged between the heating part and the crucible assembly.

6. The heater assembly according to claim 1, wherein a heat-insulating protective cover covers on a side of the heating part away from the crucible assembly.

7. A single crystal puller, comprising a heater assembly for the single crystal puller, wherein the single crystal puller comprises a puller body, wherein a crucible assembly is arranged in the puller body, a bottom of the crucible assembly is supported by a support structure, the support structure comprises a support shaft, the crucible assembly is driven by the support shaft to rotate, and the heater assembly comprises:
 a heating part covering an outer surface of the crucible assembly, wherein the heating part is able to rotate synchronously with the crucible assembly, the heating part comprises a plurality of connecting electrodes; and
 a conductive part arranged on the support shaft, wherein the conductive part comprises a plurality of annular conductive members connected to the plurality of connecting electrodes respectively, and external electrodes connected to the plurality of annular conductive members respectively, the connecting electrodes are able to rotate along the annular conductive members, and the external electrodes are connected to an external power source,
wherein the conductive part comprises a cylindrical housing sleeved on the support shaft, and a plurality of annular protrusions are arranged on an inner wall of the cylindrical housing at intervals along a circumferential direction of the cylindrical housing to serve as the annular conductive members, and the external electrodes are arranged on an outer wall of the cylindrical housing and connected to the annular protrusions respectively, and
wherein the support structure comprises a support tray supporting the bottom of the crucible assembly, the support shaft is arranged at a side of the support tray away from the crucible assembly, the connecting electrodes comprise a first sub-electrode and a second sub-electrode, the first sub-electrode is connected to the heating part, one end of the second sub-electrode is connected to the first sub-electrode, and the other end of the second sub-electrode is connected to the conductive part through a conductor which passes through the support tray and is fixed on the support shaft.

* * * * *